United States Patent [19]

Gutteridge et al.

[11] 4,037,306
[45] July 26, 1977

[54] INTEGRATED CIRCUIT AND METHOD

[75] Inventors: Ronald J. Gutteridge, Scottsdale; George A. Stickney, Mesa, both of Ariz.

[73] Assignee: Motorola, Inc., Chicago, Ill.

[21] Appl. No.: 619,121

[22] Filed: Oct. 2, 1975

[51] Int. Cl.² ............................................. B01J 17/00
[52] U.S. Cl. .................................... 29/577; 29/578; 29/580; 29/589; 357/49
[58] Field of Search ............ 29/578, 580, 577, 589; 357/49

[56] References Cited

U.S. PATENT DOCUMENTS

| 3,046,176 | 7/1962 | Bosenberg | 29/580 |
| 3,575,740 | 4/1971 | Castrucci | 29/580 |
| 3,780,426 | 12/1973 | Ono | 29/580 |
| 3,883,948 | 5/1975 | Allison | 29/580 |
| 3,911,562 | 10/1975 | Youmans | 29/580 |
| 3,912,556 | 10/1975 | Grenon | 29/580 |

*Primary Examiner*—W. Tupman
*Attorney, Agent, or Firm*—Robert A. Farley

[57] ABSTRACT

An integrated circuit structure is provided in which component isolation is achieved after all diffused junction formation is complete. An anisotropically etched moat provides isolation. The surfaces of the moat are lined with oxide and a planar wafer surface is restored by filling the moat with metal. The subsurface metal region can then be used as a conductor for component interconnection.

5 Claims, 12 Drawing Figures

INTEGRATED CIRCUIT AND METHOD

BACKGROUND

The present invention pertains in general to fabrication of semiconductor devices and, in particular, to methods for manufacturing high density integrated circuits in which anisotropically etched moats around devices on the integrated circuit are filled with metal to restore surface planarity.

The continued evolution of methods of manufacturing high density integrated circuits has resulted in several alternatives to the junction isolated integrated circuit which has dominated the integrated circuit industry for so many years. The junction isolation approach has basic limitations which affect how closely integrated circuit devices may be spaced with respect to each other in the design of an integrated circuit chip. The spacing between devices must allow for side diffusion since the isolation diffusion region widens with the subsequent diffusions used to form the junctions of the finished semiconductor device. Also since the isolation region and the base regions of the finished integrated circuit are formed using independent photoresist and masking operations, the integrated circuit layout in a junction isolated approach must allow for alignment tolerances. Further, the spacing of semiconductor device regions must allow for the voltage depletion between regions during normal operation. These requirements derive from the fact that since the isolating junction is a potentially active device region, it must not touch or reach through to the base region of an associated integrated circuit device if correct electrical operation is to be maintained.

Several passive isolation schemes have been proposed to eliminate the difficulties associated with junction isolation in integrated circuit fabrication. One method substitutes an oxidation for the deep isolation diffusion such that by converting exposed silicon at the surface into an oxide, an insulating region is formed between adjacent semiconductor devices. A basic advantage to this approach is that it eliminates the base alignment sensitivity associated with a junction isolated approach. If the base region should touch the isolation, it is merely touching a passive oxide area and there is no electrical effect on the integrated circuit.

In spite of its advantages, the process of oxidizing from the upper surface to form a passive isolation region suffers from inherent limitations associated with the oxide growth process. The conversion of exposed silicon to oxide to a given depth below an exposed silicon surface requires the growth of approximately twice that amount of oxide above the surface. For thicknesses beyond 20,000 angstroms of oxide, oxide growth slows to the point of impracticality and thus the oxide isolation approach is limited to semiconductor devices formed in epitaxial layers from one and a half microns to 2 microns thick. Thus the approach requires critically thin epitaxial layers which are more difficult and more costly to provide and which place limitations on the kinds of electrical performance attainable from the resulting semiconductor devices on the final integrated circuit.

Another method proposed for overcoming the difficulties associated with junction isolation is the use of anisotropic etching to form a moat or V-groove which physically isolates a semiconductor device region. Diffused isolation processes and oxide isolation processes are basicaly isotropic, i.e., the formation of the isolation region proceeds at the same rate in all directions. In contrast, the fundamental nature of anisotropic etchants is to etch along a particular plane of the crystal lattice more rapidly than along other planes of the crystal lattice. A typical anisotropic etchant attacks the [111] plane of the crystal lattice approximately 25 times faster than it attacks the [100] plane of that same lattice. Thus in an integrated circuit structure comprising a [100] crystal substrate upon which has been formed an overlying epitaxial layer which will consequently also have a [100] crystal orientation, anisotropic etching results in the formation of V-grooves whose sidewalls are slanted at approximately 54° to the semiconductor surface. These steeply sloped V-grooves allow adjacent semiconductor device regions to be closely located with respect to each other even in the case of realtively thick epitaxial layers.

In integrated circuits which take advantage of the reduced device spacing attainable using V-groove isolation techniques, the final integrated circuit density is often limited by the location and spacing of the interconnection metal which must be used to functionally interconnect the devices of the finished integrated circuit. Paradoxically, the high density air-isolated device structure attainable using V-groove isolation introduces new problems in a "metal limited" integrated circuit of this type. This problem arises because the surface irregularities associated with the formation of V-grooves create a variety of photoresist and mask exposure problems which make it impossible to attain the metal spacing tolerances achievable with a planar semiconductor surface.

SUMMARY

Accordingly, it is an object of this invention to provide an improved planar integrated circuit structure utilizing metal filled isolation regions.

It is a further object of this invention to provide an improved integrated circuit structure which achieves high density by using anisotropically etched V-grooves between adjacent devices and which achieves surface planarity by disposing a metallic region in the V-grooves.

It is a further object of this invention to provide an improved integrated circuit structure in which anisotropically etched V-grooves form isolation regions between adjacent devices and in which metal disposed in the V-grooves restores surface planarity and simultaneously provides a subsurface metallic conductor which can be used for additional component interconnection.

It is a further object of this invention to provide an improved method for manufacturing integrated circuits in which component isolation is achieved after all diffusions and junction formations are complete.

It is a further object of this invention to provide an improved method for manufacturing integrated circuits in which component isolation is achieved by anisotropically etching a moat or V-groove between adjacent devices, lining the surface of the V-grooves with oxide and restoring a planar surface to the semiconductor structure by filling the oxide-lined grooves with a metal.

In accordance with the aforementioned objects, the present invention provides an improved integrated circuit structure in which component isolation is achieved after all diffusions and junction formations are complete through the steps of etching a moat to isolate device regions, lining the surfaces of the moat with an oxide and filling the lined moat with a metal to restore a planar surface to the semiconductor structure, the subsurface metal in the isolation region providing an additional conductor network for component interconnection.

DETAILED DESCRIPTION

The buried metal conductor method by which component isolation is achieved in an integrated circuit according to the present invention will now be described in terms of the detailed fabrication steps used to manufacture the preferred embodiment together with the attached figures which show the structure of the integrated circuit device being fabricated at various stages in the process. To simplify the discussion, conventional process steps will be described only briefly, while those steps relating to the novel aspects of the process will be described in greater detail.

Figure 1:
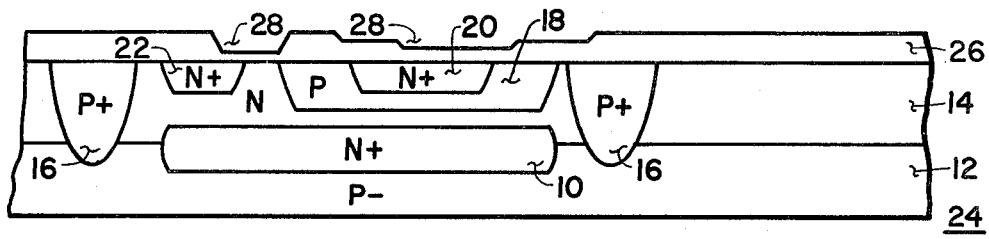
FIG. 1 shows a cross-sectional view of a semiconductor structure manufactured using the prior art method of junction isolation.

By means of comparison and to establish an initial reference point for the following discussion, FIG. 1 shows a cross-sectional view of a partially fabricated conventional integrated circuit structure in which all diffusion steps have been completed and a partially fabricated structure is ready for preohmic masking. FIG. 1 shows an N+ buried layer 10 formed in a P-type semiconductor body 12 by diffusing an arsenic impurity into the semiconductor body 12 and thereafter growing an N-type epitaxial silicon layer 14 (typically 0.3 ohm-centimeter resistivity, 5 microns thick). The P-type semiconductor body 12 has [100] crystal orientation. Subsequent conventional masking and diffusion steps form the P+ isolation region 16, the P-type base region 18 and the N+ emitter region 20 and the N+ collector contact region 22. The resulting semiconductor structure 24 has an overlying silicon dioxide layer 26 whose thickness profile varies as at 28 in accordance with the particular sequence of etching and diffusion steps associated with the underlying structure.

Figure 2:
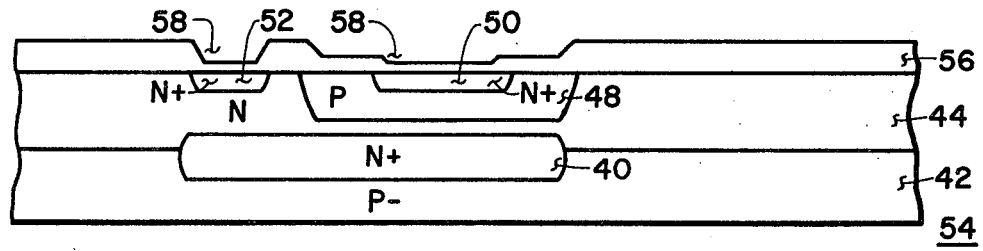
FIG. 2 through FIG. 12 show cross-sectional views of the semiconductor structure at various stages of the manufacturing method of the present invention.

Having established a semiconductor structure of FIG. 1 as the reference, we now turn to FIG. 2 which shows a partially fabricated integrated circuit structure ready for the process steps which will accomplish metal-filled V-groove isolation according to the present invention. FIG. 2 shows a semiconductor substrate in which an N+ buried layer 40 is formed in a P-type semiconductor body 42 (crystal orientation [100]) and thereafter growing an N-type epitaxial silicon layer 44 as previously described for FIG. 1. Conventional masking and diffusion steps are then used to form a P-type base region 48 and N+ emitter and collector contact regions 50 and 52, again paralleling the process steps described for FIG. 1. The resulting semiconductor structure 54 is covered with an overlying layer of thermally grown silicon dioxide 56 which varies in profile as at 58 in accordance with the process steps which have occurred. In comparing the resultant semiconductor structure 54 shown in FIG. 2 with the previously described semiconductor structure 24 shown in FIG. 1, it is of critical importance to notice that semiconductor structure 54 does not contain P+ isolation diffusions analogous to the diffusion 16 shown in FIG. 1. It is also of importance to notice that the N+ emitter diffusion 50 and collector contact diffusion 52 are not yet as deep as the corresponding diffusions 20 and 22 shown in FIG. 1. The importance of these differences will be made clear in the following discussion of subsequent process steps.

Figure 3:
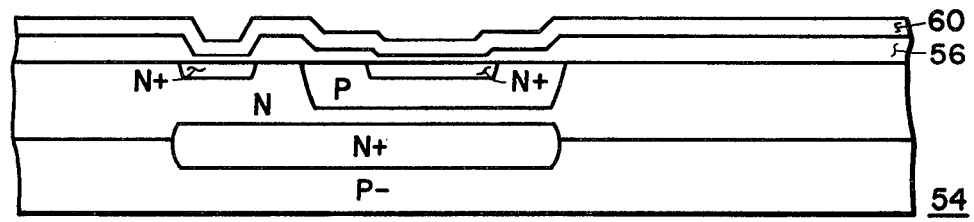

In the steps of FIG. 3, an overlying metal layer 60 is formed over the uppermost surface of the semiconductor structure 54. As will be made clear by the subsequent processing steps, the functional requirement for this metal layer is that it not be attached by oxide etchants but that it in turn is capable of being etched by metal etchants which do not attack the underlying oxide and silicon layers. In the preferred embodiment, the overlying metal layer 60 is formed of an alloy of nickel and chromium which after evaporation has a composition of about 70% chromium and 30% nickel and is about 500 angstroms thick.

Figure 4:
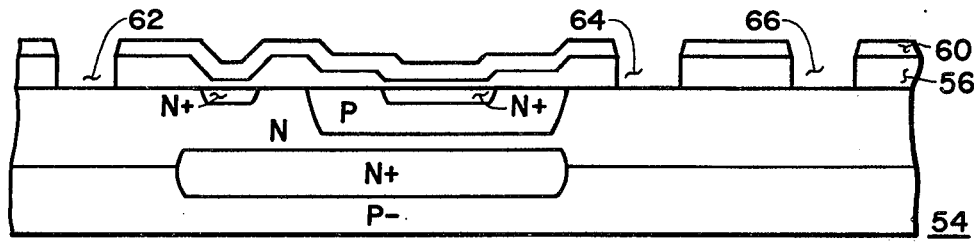

In the process step of FIG. 4 conventional photoresist and masking operations followed by a metal etch and a subsequent oxide etch remove portions of the overlying metal layer 60 and the oxide layer 56 to expose the upper surface of the epitaxially grown silicon layer 44 in region 62, 64 and 66. Regions 62 and 64 represent an intersection through the isolation region to be formed around the semiconductor device associated with the buried layer region 40 the base region 48 and the emitter and collector contact regions 50 and 52. Although alternative etchants can be used, in the preferred embodiment, a ceric sulphate solution is used as the etchant for the nickel chromium layer 60 and a buffered hydrogen fluoride solution is used as the etchant for the oxide layer 56 in forming the openings at 62, 64 and 66.

Figure 5:
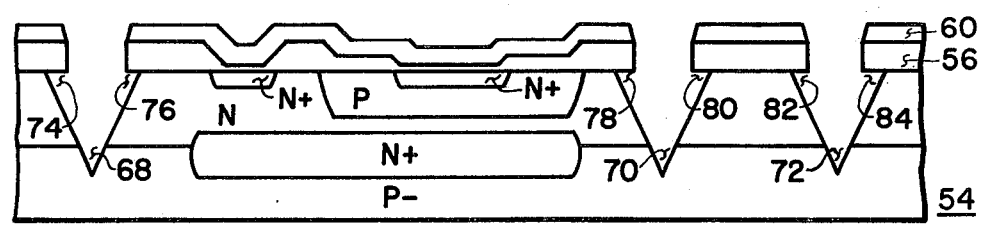
Figure 6:
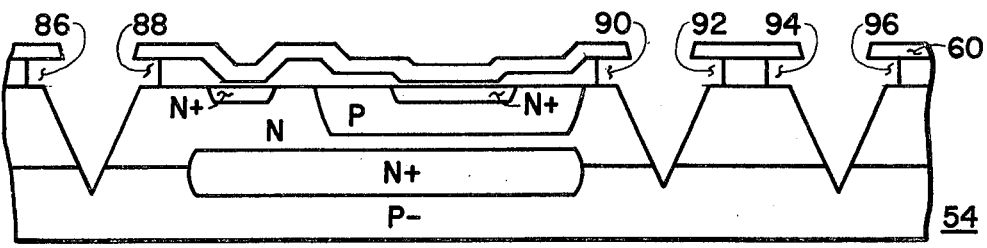

In the process step of FIG. 5, the semiconductor body 54 is treated with an anisotropic etchant. This etchant attacks the exposed silicon at regions 62, 64 and 66 of FIG. 4 to form the groove regions 68, 70 and 72. As is well known, the formation of these V grooves results from the fact that an anisotropic etchant attacks the [100] plane of the crystal lattice approximately 25 times faster than it attacks the [111] plane of the crystal lattice. The result of this preferential etching is a V-groove whose sidewall is inclined at an angle of approximately 54° with respect to the plane of the silicon surface. In the preferred embodiment, the anisotropic etching is accomplished using an etchant based on potassium hydroxide although numerous other types of anisotropic etchants could be used. Because anisotropic etching proceeds both vertically and laterally (although at substantially different rates) with respect to the silicon surface, the etching step of FIG. 5 results in a small overhanging region of oxide at the top of each of the V-grooves, as shown at 74, 76, 78, 80, 82 and 84. These overhanging oxide regions must be removed to allow unobstructed access to the V-groove in subsequent processing steps. In the step of FIG. 6 the overhanging oxide regions shown in FIG. 5 are removed by treating the semiconductor substrate 54 with an oxide etch. The overlying metal layer 60 masks the upper surface of the semiconductor structure such that the oxide etchant affects only the exposed oxide areas at the edges of the V-grooves resulting in an oxide-free upper periphery of the V-grooves as shown at 86, 88, 90, 92, 94 and 96 in FIG. 6.

Figure 7:
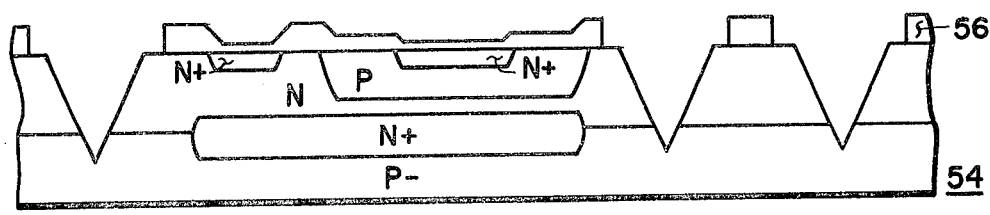

In the process step of FIG. 7 the overlying metal layer 60 shown in FIG. 6 has completed its masking function and it is removed using a metal etchant which in the preferred embodiment is a ceric sulphate solution. This leaves the upper surface of oxide layer 56 exposed for subsequent processing steps.

Figure 8:
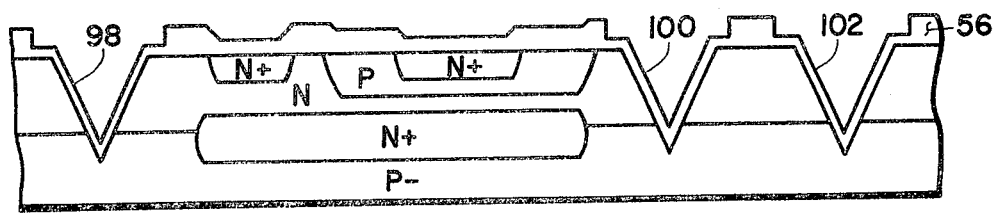

In the step of FIG. 8 a thermally grown silicon dioxide layer (approximately 3,000 angstroms thick) is grown to line the exposed silicon surface of the V-grooves at 98, 100, and 102 such that the oxide layer 56 once again provides a continuous covering for the entire upper surface of semiconductor structure 54. The thermal step of FIG. 8 has the additional function of establishing the final junction depth of emitter region 50 and collector contact region 52. The original junction depth established for these regions was predicated on the additional time-temperature product which would be required to grow a sufficiently thick layer of oxide over the exposed upper surfaces of V-grooves.

Figure 9:
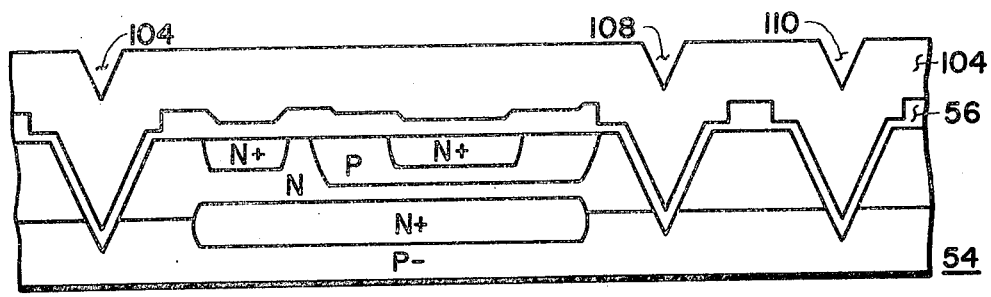

In the step of FIG. 9, a metallic layer 104 is formed over the upper surface of oxide layer 56. The function of overlying metallic layer 104 is to provide metal to fill the V-grooves which were formed in the silicon surface and coated with oxide layer 56 in previous processing steps. Overlying metal layer 104 is formed with sufficient thickness to insure that the "footprint" of the underlying V-groove at 106, 108 and 110 will be above the uppermost surfaces of oxide layer 56. This guarantees that the V-grooves will remain completely filled with metal after subsequent processing steps. In the preferred embodiment a layer of aluminum silicon alloy approximately 10 microns thick is evaporated over the upper surface of semiconductor structure 54.

Figure 10:
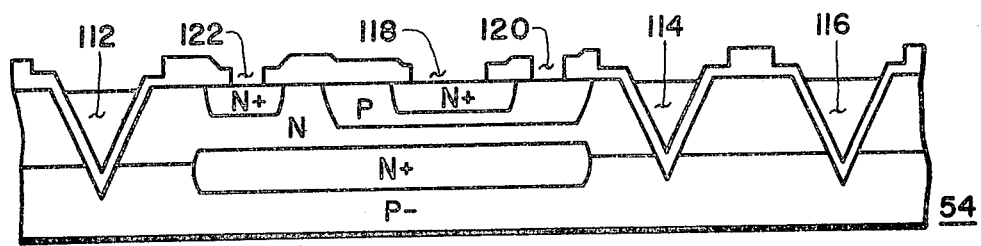

In the step of FIG. 10, the upper part of metallic layer 104 has been removed such that the only metal remaining is the metal filling the V-grooves as at 112, 114 and 116. In the preferred embodiment the excess of aluminum silicon layer 104 is removed by polishing. It is to be noted that due to the relative hardness of the silicon dioxide layer 56 with respect to the overlying metal layer 104, conventional polishing operations have an inherent scrubbing action which makes it possible to remove the upper portion of layer 104 down to the original surface of epitaxial layer 44. The key element of this process according to the present invention is that metal regions 112, 114 and 116 formed in the V-grooves in the top surface of semiconductor structure 54 restore the surface planarity required for subsequent metallization steps. This is accomplished with a process which can be performed at low temperature using a material which is relatively easy to remove (for example by polishing). A further important advantage is that regions 112, 114 and 116, being metallic, can function as electrical conductors which have the capability of forming another interconnect system for the semiconductor devices formed in semiconductor body 54. The step of FIG. 10 also includes a conventional photoresist, preohmic mask and etching process for forming openings in oxide layer 56 to expose emitter area 118, base area 120, and collector contact area 122 for subsequent metal contact.

Figure 11:
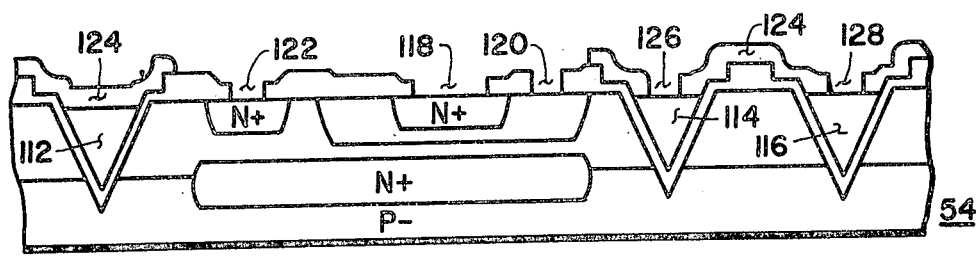

In the step of FIG. 11, a layer of low temperature glass 124 is formed over the upper surface of the semiconductor structure 54. This layer protects and insulates the metal regions 112, 114 and 116 contained in the V-grooves and has the effect of making them "buried" conductors. In the preferred embodiment, a chemically vapor deposited glass is used to form the glass layer 124. Subsequent to the formation of glass layer 124, conventional photoresist masking and etching techniques are used to re-expose the emitter contact area 118, base contact area 120 and collector contact area 122. This masking and etching step also provides openings 126 to buried metal region 114 and opening 128 to buried metal region 116.

Figure 12:
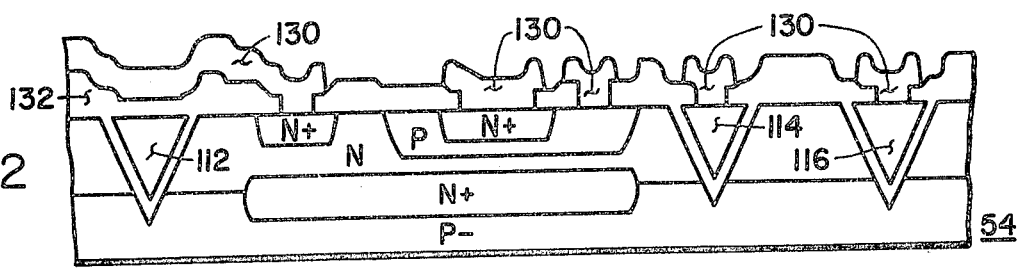

In the step of FIG. 12 a metal layer 130 is formed over the upper surface of semiconductor body 54 and conventional photoresist masking and metal etching steps are used to form an interconnection system. The interconnecting metal layer 130 forms an emitter contact at 118 a base contact at 120 and a collector contact 122. The interconnecting metal layer 130 also forms a contact 126 with buried metal conductor 114 and a contact 128 with buried metal conductor 116. The metal filled V-groove structure according to the present invention thus effectively forms a two level system of interconnecting metal regions in which the upper metal layer 130 can be insulated from a buried conductor, for example the insulation of buried conductor 112 by the oxide region 132, or which can be contacted as in the contact of buried conductor 114 at region 126.

After completion of the metallization step of FIG. 12, conventional processing is used to provide the upper surface of semiconductor structure 54 with a protective layer of oxide (not shown). This protective layer of oxide can be used to provide the final passivation coating for the semiconductor device or to provide the insulating layer required for a multilayer metal interconnection system.

In alternative embodiments (not shown), the method of the present invention can be used to form high density integrated circuit device structures. This is accomplished by performing one or more diffusions in the exposed silicon surface of the V-groove (FIG. 7) before proceeding with subsequent oxidation and metallization steps. This approach is particularly useful in reducing the chip area required for new forms of digital logic such as integrated injection logic.

What is claimed is:
1. A method for manufacturing an integrated circuit comprising the steps of:
 a. providing a semiconductor substrate having an upper layer;
 b. forming device junctions in said upper layer;
 c. forming an oxide layer over the surface of said upper layer;
 d. forming a metal masking layer over the surface of said oxide layer;
 e. forming a predetermined pattern of openings through said metal masking and oxide layers;
 f. forming recessed regions in the surface of said semiconductor substrate using said predetermined pattern of openings as a mask, said recessed regions extending below the surface through said upper layer thereby isolating device regions containing said device junctions;
 g. removing portions of said oxide layer overhanging the periphery of said recessed regions using said metal masking layer as a mask;
 h. removing said metal masking layer without removing said oxide layer;
 i. forming a thin insulating layer in said recessed regions;
 j. forming metal regions in said recessed regions, the surface of said metal regions coinciding with said surface of said upper layer; and
 k. electrically connecting said metal regions to a potential source to form an equipotential interconnecting network, said network selectively connect- able to said device junctions and to other electrical components of said integrated circuit.

2. A method as recited in claim 1 wherein said metal masking layer is formed of an alloy of nickel and chromium.

3. A method as recited in claim 1 wherein said metal regions are formed of a metal whose melting point temperature is less than the temperature required to form a diffused junction.

4. A method as recited in claim 3 wherein said metal regions are aluminum.

5. A method as recited in claim 4 wherein said semiconductor substrate has a [100] surface and said recessed regions are formed by anisotrophic etching.

* * * * *